United States Patent
Kaneko et al.

(10) Patent No.: US 8,476,536 B2
(45) Date of Patent: Jul. 2, 2013

(54) WIRING SUBSTRATE AND METHOD FOR MANUFACTURING THE SAME

(75) Inventors: Kentaro Kaneko, Nagano (JP); Kotaro Kodani, Nagano (JP); Junichi Nakamura, Nagano (JP); Kazuhiro Kobayashi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 899 days.

(21) Appl. No.: 11/987,617

(22) Filed: Dec. 3, 2007

(65) Prior Publication Data

US 2008/0149383 A1   Jun. 26, 2008

(30) Foreign Application Priority Data

Dec. 4, 2006 (JP) .............................. P.2006-327493

(51) Int. Cl.
  *H05K 1/11* (2006.01)
(52) U.S. Cl.
  USPC ........................................................ 174/262
(58) Field of Classification Search
  USPC .. 174/256, 257, 260, 262, 264, 266; 257/700, 257/751, 759, 774, 786; 438/622, 623
  See application file for complete search history.

(56) References Cited

U.S. PATENT DOCUMENTS

| | | | |
|---|---|---|---|
| 6,988,312 B2 | 1/2006 | Nakamura et al. | |
| 7,067,918 B2 | 6/2006 | Murata et al. | |
| 7,071,424 B1 | 7/2006 | Shirai et al. | |
| 7,179,738 B2 * | 2/2007 | Abbott | 438/654 |
| 7,504,719 B2 * | 3/2009 | En et al. | 257/700 |
| 2002/0192939 A1 | 12/2002 | Sugihara | |
| 2005/0252682 A1 | 11/2005 | Shimoto et al. | |
| 2006/0145345 A1 | 7/2006 | Choi et al. | |
| 2006/0175084 A1 * | 8/2006 | Okamoto et al. | 174/262 |
| 2007/0018332 A1 * | 1/2007 | Ueno | 257/774 |

FOREIGN PATENT DOCUMENTS

| | | |
|---|---|---|
| JP | 2003-179358 | 6/2003 |
| JP | 2004-300570 A | 10/2004 |
| JP | 2005-327780 | 11/2005 |
| WO | 03/039219 | 5/2003 |
| WO | WO 2006/009850 A2 | 1/2006 |

OTHER PUBLICATIONS

Notification of Reasons for Refusal dispatched Sep. 4, 2012 in corresponding Japanese Patent Application No. 2006-327493 with English Translation.
Office Action from corresponding Japanese Patent Application No. JP-OA 2006-327493 dated Sep. 4, 2012 and in English translation thereof (6 pages).

* cited by examiner

*Primary Examiner* — Jeremy Norris
*Assistant Examiner* — Tremesha S Willis
(74) *Attorney, Agent, or Firm* — Drinker Biddle & Reath LLP

(57) ABSTRACT

A wiring substrate has pads formed from a plurality of metal layers and vias connected to the pads. The plurality of metal layers have a metal layer exposed through the wiring substrate, and a first metal layer which is interposed between the metal layer and the vias and which prevents diffusion of metal included in the vias into the metal layer. A second metal layer which is less subject to oxidation than the first metal layer is provided between the vias and the first metal layer, and the vias are connected to the second metal layer.

21 Claims, 14 Drawing Sheets

… (1) …

WIRING SUBSTRATE AND METHOD FOR MANUFACTURING THE SAME

This application claims priority to Japanese Patent Application No. 2006-327493, filed Dec. 4, 2006, in the Japanese Patent Office. The priority application is incorporated by reference in its entirety.

TECHNICAL FIELD

The present disclosure relates to a wiring substrate having a pad which includes a metal layer exposed through a wiring substrate and a first metal layer interposed between the metal layer and vias for preventing diffusion of metal included in the vias into the metal layer.

RELATED ART

FIG. 1 is a cross-sectional view of a related-art wiring substrate.

By reference to FIG. 1, a related-art wiring substrate 100 includes resin layers 101, 106, and 111; pads 102; vias 103, 107, and 112; and wiring lines 104, 108, and 113. The wiring substrate 100 is a coreless substrate.

The resin layer 101 is provided so as to cover upper surfaces and side surfaces of the respective pads 102. The resin layer 101 has opening sections 115 through which upper surfaces (specifically, upper surfaces 117A of a Ni layer 117) of the pads 102 are exposed.

The pad 102 has an Au layer 116 and an Ni layer 117. The Au layer 116 is provided on the resin layer 101. A lower surface 116A of an Au layer 116 is made essentially flush with a lower surface 101B of the resin layer 101. The Ni layer 117 is provided on the Au layer 116. Portions of the side and upper surfaces of the Ni layer 117 are covered with the resin layer 101. The Ni layer 117 has a function of preventing diffusion of Cu included in the vias 103 into the Au layer 116. The pads 102 are pads for connection with a semiconductor chip or pads functioning as external connection terminals.

The vias 103 are provided in the opening sections 115. Each of the vias 103 has a seed layer 121 covering the opening section 115 and a Cu film 122 provided on the seed layer 121. A lower end of each of the vias 103 is connected to the Ni layer 117.

The wiring lines 104 are provided over an upper surface 101A of the resin layer 101 from upper end portions of the vias 103. The wiring lines 104 are provided integrally with the respective vias 103, and each of the wiring lines 104 has the seed layer 121 provided on the upper surface 101A of the resin layer 101 and the Cu film 122 provided on the via 103 and the seed layer 121.

The resin layer 106 is provided on the resin layer 101 so as to cover portions of the wiring lines 104. The resin layer 106 has an opening section 124 through which portions of the upper surface of the wiring line 104 are exposed.

The vias 107 are provided in the respective opening sections 124. Each of the vias 107 has a seed layer 126 covering the opening section 124 and a Cu film 127 provided on the seed layer 126. A lower end of each of the vias 107 is connected to the wiring line 104.

The wiring lines 108 are provided over an upper surface 106A of the resin layer 106 from upper end portions of the vias 107. The wiring lines 108 are provided integrally with the respective vias 107, and each of the wiring lines 108 has the seed layer 126 provided on the upper surface 106A of the resin layer 106 and the Cu film 127 provided on the via 107 and the seed layer 126.

The resin layer 111 is provided over the resin layer 106 so as to cover portions of the wiring lines 108. The resin layers 111 have opening sections 131 through which portions of the upper surface of the wiring line 108 are exposed.

The vias 112 are provided in the respective opening sections 131. Each of the vias 112 has a seed layer 133 covering the opening section 131 and a Cu film 134 provided on the seed layer 133. A lower end of each of the vias 112 is connected to the wiring line 108.

The wiring lines 113 are provided over an upper surface 111A of the resin layer 111 from upper end portions of the vias 112. The wiring lines 113 are provided integrally with the respective vias 112. Each of the wiring lines 113 has the seed layer 133 provided on the upper surface 111A of the resin layer 111 and the Cu film 134 provided on the via 112 and the seed layer 133.

FIGS. 2 through 12 are views showing process for manufacturing the related-art wiring substrate. In FIGS. 2 through 12, structures identical with those of the wiring substrate 100 shown in FIG. 1 are assigned the same reference numerals.

To begin with, in processes shown in FIG. 2, a metal plate 136 serving as a support plate at the time of formation of the wiring substrate 100 is prepared. Subsequently, in a process shown in FIG. 3, a resist film 138 having opening sections 138A is formed on the metal plate 136.

Subsequently, in a process shown in FIG. 4, an Au layer 116 and an Ni layer 117 are sequentially provided on a metal plate 136 exposed through the opening sections 138A by Cu electroplating, thereby forming the pads 102.

Next, in a process shown in FIG. 5, the resist film 138 shown in FIG. 4 is eliminated, and the resin layer 101 having the opening sections 115 is formed over the metal plate 136 and the pads 102. The opening sections 115 are formed by means of; for example, subjecting the resin layer 101 to laser processing.

In a process shown in FIG. 6, the seed layer 121 is formed by electroless Cu plating so as to cover the upper layer 101A of the resin layer 101 and side surfaces and bottom surfaces of the opening sections 115. In a process shown in FIG. 7, a resist film 141 having opening sections 141A is formed over the seed layer 121.

In a process shown in FIG. 8, the Cu film 122 is formed on the seed layer 121 exposed through the opening sections 141A by means of electrolytic plating during which the seed layer 121 is taken as a feeding layer. Thereby, the vias 103, each of which is formed from the seed layer 121 and the Cu film 122, are formed in the respective opening sections 115.

In a process shown in FIG. 9, the resist film 141 shown in FIG. 8 is eliminated. Next, in a process shown in FIG. 10, the seed layer 121 (see FIG. 9) which is not covered with the Cu film 122 (see FIG. 9) is etched away. Thereby, the wiring lines 104 are formed.

Next, in a process shown in FIG. 11, processing analogous to that pertaining to the previously-described processes shown in FIGS. 5 through 10 is iterated, whereby the resin layers 106 and 111, the vias 107 and 112, and the wiring lines 108 and 113 are formed on the metal plate 136. Thereby, a structure corresponding to the wiring substrate 100 is formed over the metal plate 136.

In a process shown in FIG. 12, the metal plate 136 shown in FIG. 11 is etched away. Thereby, the wiring substrate 100 is manufactured (see., e.g., International Publication No. 2003/039219 Brochure (Patent Document 1)).

However, since the Ni layer 117 is easy to be subject to oxidation, an oxide of Ni is formed on the upper surface of the Ni layer 117 of the structure shown in FIG. 5. Therefore, when the Ni layer 117 on which the oxide is formed is connected to the vias 103, there arises a problem of a failure to sufficiently ensure the reliability of an electrical connection between the pads 102 and the vias 103 as a result of a decrease in adhesion between the pads 102 and the vias 103.

SUMMARY

Exemplary embodiments of the present invention provide a wiring substrate which enables sufficient assurance of electrical connection reliability between pads and vias, as well as providing a method for manufacturing the same.

According to one aspect of the present invention, there is provided a wiring substrate comprising a pad including a plurality of metal layers and a via connected to the pad, wherein the plurality of metal layers have a metal layer exposed through the wiring substrate and a first metal layer which is interposed between the metal layer and the via and which prevents diffusion of metal included in the via into the metal layer, and a second metal layer which is less subject to oxidation than the first metal and which is provided between the via and the first metal layer, and wherein the via is connected to the second metal layer.

According to the present invention, the second metal layer that is less subject to oxidation than the first metal layer is provided between the vias and the first metal layer, and the vias are connected to the second metal layer. As a result, the vias are not connected to the first metal layer, thereby preventing presence of an oxide between the pads and the vias. As a result, adhesion between the pads and the vias is enhanced, so that reliability of electrical connection between the pads and the vias can be ensured sufficiently.

According to another aspect of the present invention, there is provided a method for manufacturing a wiring substrate comprising a pad formation process for forming a pad including a plurality of metal layers, the plurality of metal layers having a metal layer exposed through the wiring substrate, a first metal layer which is provided on the metal layer and which prevents diffusion of metal included in a via into the metal layer, and a second metal layer which is provided on the first metal layer and which is less subject to oxidation than the first metal layer; and a via formation process for forming the via on the second metal layer.

The pad formation process may include a first and second metal layer formation process for continuously forming the first metal layer and the second metal layer by means of plating.

According to the present invention, the first metal layer and the second metal layer that is less subject to oxidation than the first metal layer are formed continuously by means of plating, thereby reducing a time during which the first metal layer is oxidized. Hence, adhesion between the first metal layer and the second metal layer can be enhanced.

Further, as a result of the vias and the second metal layer that is less subject to oxidation than the first metal layer being connected together, adhesion between the pads and the vias is enhanced. Therefore, reliability of electrical connection between the pads and the vias can be ensured sufficiently.

According to the present invention, the reliability of electrical connection between pads and vias can be ensured sufficiently.

Other features and advantages may be apparent from the following detailed description, the accompanying drawings and the claims.

DETAILED DESCRIPTION

Embodiments of the present invention will now be described by reference to the drawings.

First Embodiment

Figure 13:
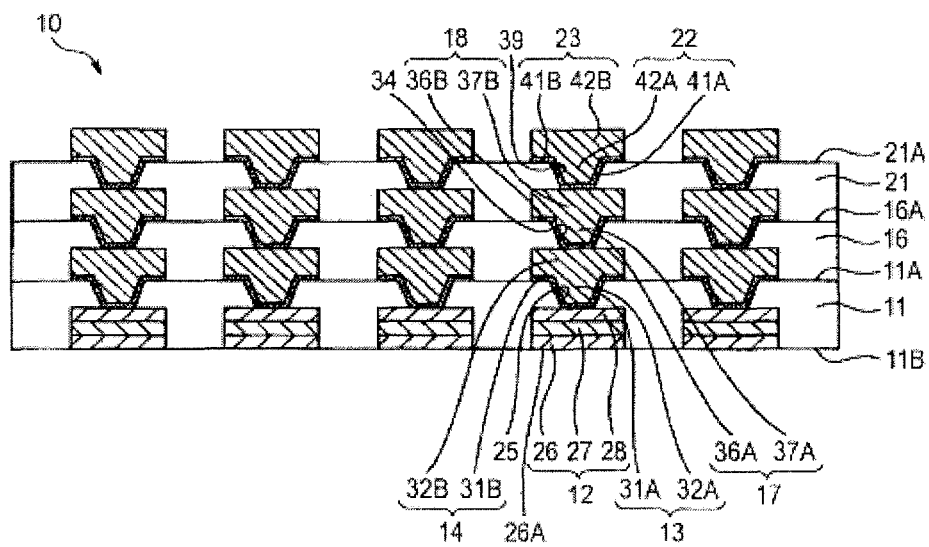
FIG. 13 is a cross-sectional view of a wiring substrate of a first embodiment of the present invention.
Figure 14:
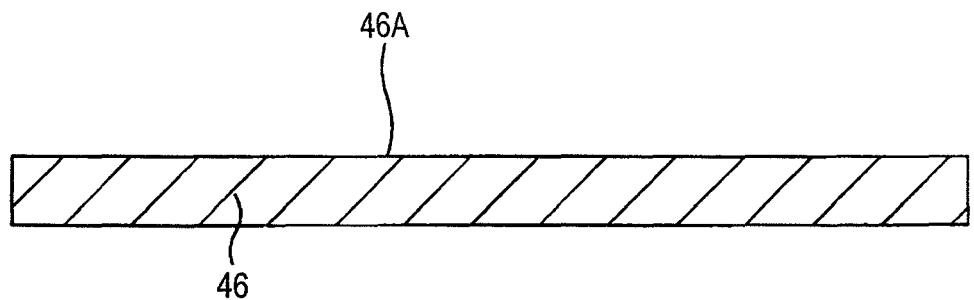
FIG. 14 is a view showing processes for manufacturing the wiring substrate of the first embodiment of the present invention (Part 1)

FIG. 13 is a cross-sectional view of a wiring substrate of a first embodiment of the present invention.

By reference to FIG. 13, a wiring substrate 10 of a first embodiment has insulation layers 11, 16, and 21; pads 12; vias 13, 17, and 22; and wiring lines 14, 18, and 23.

The insulation layer 11 is provided so as to cover an upper surface (an upper surface of a metal layer 28 which is less subject to oxidation) and side surfaces of each of the pads 12. The insulation layer 11 has opening sections 25 through which upper surfaces (specifically, the upper surface of the metal layer 28 that is less subject to oxidation) of the pads 12 are exposed. A resin layer; for example, polyimide, epoxy, or the like, can be used as the insulation layer 11.

Each of the pads 12 is structured in such a way that a metal layer 26, a metal layer 27 (a first metal layer), and the metal layer 28 (a second metal layer) which is less subject to oxidation) are sequentially provided. The metal layer 26 is provided on the insulation layer 11. Side surfaces of the metal layer 26 are covered with the insulation layer 11. A lower surface 26A of the metal layer 26 is made essentially flush with a lower surface 11B of the insulation layer 11. The lower surface 26A of the metal layer 26 is exposed through the insulation layer 11. For instance, an Au layer, an Sn layer, an SnAg layer (an alloy formed from Sn and Ag by means of plating), and the like, can be used. When an Au layer is used as the metal layer 26, the thickness of the metal layer 26 can be set to; for example, 0.1 μm.

The metal layer 27 is provided on the metal layer 26. Side surfaces of the metal layer 27 are covered with the insulation layer 11. The metal layer 27 is a layer for preventing diffusion of metal (specifically Cu) included in the vias 13 from diffusing into the metal layer 26, and have the property of being easy to be subject to oxidation. The metal layer 27 is formed from metal, whose change amount of free energy ΔF converted as a result of oxidation of metal per gram atom of oxygen is less than −32 kcal. For instance, an Ni layer can be used as the metal layer 27. The change amount of free energy ΔF converted as a result of oxidation of Ni per gram atom of oxygen is −46.1 kcal. When the Ni layer is used as the metal layer 27, the thickness of the metal layer 27 can be set to; for example, 10 μm.

The metal layer 28 is a metal layer which is less subject oxidation than the metal layer 27, and provided on the metal layer 27. Portions of side surfaces and an upper surface of the metal layer 28 are covered with the insulation layer 11. An upper portion of the metal layer 28 is connected to the respective vias 13. A metal layer formed from metal, whose change amount of free energy ΔF converted as a result of oxidation of metal per gram atom of oxygen is greater than −32 kcal, can be used as the metal layer 28. For instance, Cu (ΔF=−31.5 kcal), Ag (ΔF=+0.6 kcal), Au (ΔF=+10.5 kcal), Pd, and the like, are available as metal applicable to such a metal layer. For instance, a Cu layer, an Ag layer, an Au layer, a Pd layer, and the like, can be used as the metal layer 28 that is less subject to oxidation. When a Cu layer is used as the metal layer 28, the thickness of the metal layer 28 can be set to; for example, 10 μm. A layer formed by stacking at least two of the Cu layer, the Ag layer, the Au layer, and the Pd layer may also be used as the metal layer 28.

As mentioned above, the metal layer 28 that is less subject to oxidation than the metal layer 27 is provided on the metal layer 27 that is easy to be subject to oxidation, and the metal layer 28 and the vias 13 are connected together, thereby preventing presence of an oxide between the pads 12 and the vias 13. Thereby, in order to enhance adhesion between the pads 12 and the vias 13, the reliability of electrical connection between the pads 12 and the vias 13 can be ensured sufficiently.

The pads 12 formed as mentioned above are pads for use in connection with a semiconductor chip or serve as external connection terminals.

The vias 13 are provided in respective opening sections 25 formed in the insulation layer 11. Lower ends of the vias 13 are connected to the metal layer 28 that is one of the constituent elements of the pads 12. Each of the vias 13 has a seed layer 31A and a Cu film 32A. The seed layer 31A is provided so as to cover the insulation layer 11 located on the side surfaces of the opening sections 25 and the upper surface of the metal layer 28 exposed through the opening sections 25. The seed layer 31A is a feeding layer used at the time of formation of the Cu film 32A by means of electrolytic plating. A Cu layer formed by means of; for example, sputtering, vacuum evaporation, electroless plating, or the like, can be used as the seed layer 31A. The Cu film 32A is provided so as to fill the opening sections 25 where the seed layer 31A is formed.

The wiring lines 14 are provided so as to extend over the upper surface 11A of the insulation layer 11 from upper end portions of the respective vias 13. The wiring lines 14 are connected to the respective vias 13. Each of the wiring lines 14 has a seed layer 31B and a Cu film 32B. The seed layer 31B is provided on the upper surface 11A of the insulation layer 11 located in the vicinity of the opening sections 25. The seed layer 31B is a feeding layer used when the Cu film 32B is formed by means of electrolytic plating. A Cu layer formed by means of; for example, sputtering, vacuum deposition, electroless plating, or the like, can be used as the seed layer 31B.

The insulation layer 16 is provided on the upper surface 11A of the insulation layer 11 so as to cover portions of the wiring lines 14. The insulation layer 16 has opening sections 34 through which portions of upper surfaces of the wiring lines 14 are exposed. A resin layer; for example, polyimide, an epoxy, or the like, can be used as the insulation layer 16.

Vias 17 are provided in the respective opening sections 34 formed in the insulation layer 16. The vias 17 are connected to the wiring lines 14. Each of the vias 17 has a seed layer 36A and a Cu film 37A. The seed layer 36A is provided so as to cover the insulation layer 16 located on the side surfaces of the respective opening sections 34 and the upper surface of the wiring lines 14 exposed through the opening sections 34. The seed layer 36A is a feeding layer used when the Cu film 37A is formed by means of electrolytic plating. A Cu layer formed by means of; for example, sputtering, vacuum deposition, electroless plating, or the like, can be used for the seed layer 36A. The Cu film 37A is provided so as to fill the opening sections 34 formed in the seed layer 36A.

The wiring lines 18 are provided so as to extend over an upper surface 16A of the insulation layer 16 from upper end portions of the respective vias 17. The wiring lines 18 are connected to the vias 17. Each of the wiring lines 18 has a seed layer 36B and a Cu film 37B. The seed layer 36B is provided on the upper surface 16A of the insulation layer 16 located in the vicinity of the opening sections 34. The seed layer 36B is a feeding layer used when the Cu film 37B is formed by means of electrolytic plating. A Cu layer formed by means of; for example, sputtering, vacuum deposition, electroless plating, or the like, can be used as the seed layer 36B.

The insulation layer 21 is provided on the upper surface 16A of the insulation layer 16 so as to cover portions of the wiring lines 18. The insulation layer 21 has opening sections 39 through which portions of upper surfaces of the wiring lines 18 are exposed. A resin layer; for example, polyimide, an epoxy, or the like, can be used as the insulation layer 21.

Vias 22 are provided in the respective opening sections 39 formed in the insulation layer 21. The vias 22 are connected to the wiring lines 18. Each of the vias 22 has a seed layer 41A and a Cu film 42A. The seed layer 41A is provided so as to cover the insulation layer 21 located on the side surfaces of the respective opening sections 39 and the upper surface of the wiring lines 18 exposed through the opening sections 39. The seed layer 41A is a feeding layer used when the Cu film 42A is formed by means of electrolytic plating. A Cu layer formed by means of; for example, sputtering, vacuum deposition, electroless plating, or the like, can be used for the seed layer 41A. The Cu film 42A is provided so as to fill the opening sections 39 formed in the seed layer 41A.

The wiring lines 23 are provided so as to extend over an upper surface 21A of the insulation layer 21 from upper end portions of the respective vias 22. The wiring lines 23 are connected to the vias 22. Each of the wiring lines 23 has a seed layer 41B and a Cu film 42B. The seed layer 41B is provided on the upper surface 21A of the insulation layer 21 located in the vicinity of the opening sections 39. The seed layer 41B is a feeding layer used when the Cu film 42B is formed by means of electrolytic plating. A Cu layer formed by means of; for example, sputtering, vacuum deposition, electroless plating, or the like, can be used as the seed layer 41B.

According to the wiring substrate of the present embodiment, the metal layer 28 that is less subject to oxidation than the metal layer 27 is provided on the metal layer 27 that is easy to be subject to oxidation, and the vias 13 and the metal layer 28 that is a constituent element of the pads 12 are connected together, thereby preventing presence of an oxide between the pads 12 and the vias 13. Thereby, adhesion between the pads 12 and the vias 13 is enhanced, and the reliability of electrical connection between the pads 12 and the vias 13 can be ensured sufficiently.

FIGS. 14 through 24 are views showing processes for manufacturing the wiring substrate of the first embodiment of the present invention. In FIGS. 14 through 24, constituent elements which are the same as those of the wiring substrate 10 of the first embodiment are assigned the same reference numerals.

By reference to FIGS. 14 through 24, the method for manufacturing the wiring substrate 10 of the first embodiment will be described. To begin with, in a process shown in FIG. 14, a metal plate 46 serving as a support plate at the time of manufacture of the wiring substrate 10 is prepared. For instance, a Cu plate can be used as the metal plate 46. The thickness of the metal plate can be set to; for example, 0.3 mm. Metal foil may also be used in lieu of the metal plate 46.

Figure 15:
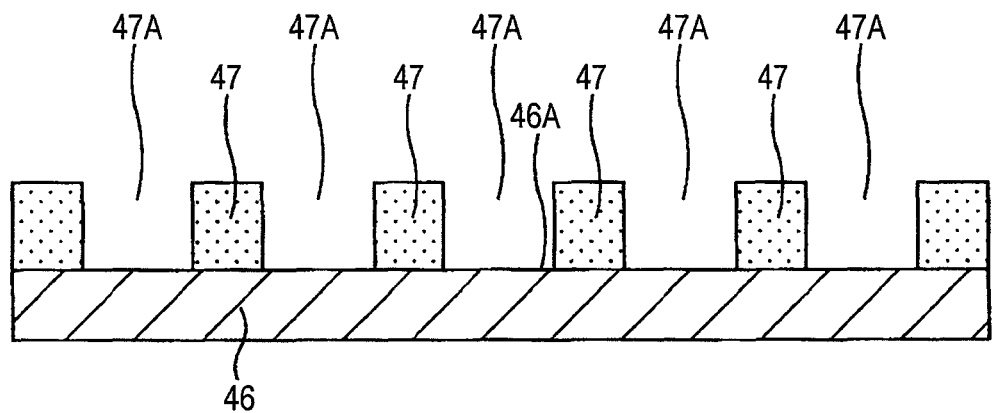
FIG. 15 is a view showing processes for manufacturing the wiring substrate of the first embodiment of the present invention (Part 2)

In a process shown in FIG. 15, a resist film 47 having opening sections 47A is formed on the metal plate 46. The opening sections 47A are formed in such a way that areas of an upper surface 46A of the metal plate 46 corresponding to the areas, where the pads 12 are formed, become exposed.

Figure 16:
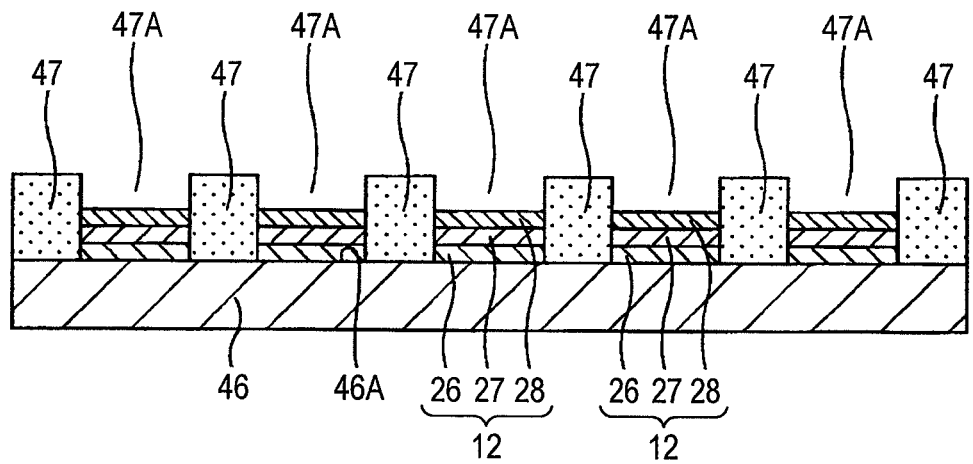
FIG. 16 is a view showing processes for manufacturing the wiring substrate of the first embodiment of the present invention (Part 3)

In a process shown in FIG. 16, the metal layer 26, the metal layer 27 that is easy to be subject to oxidation, and the metal layer 28 that is less subject to oxidation than the metal layer 27 are continuously formed, by means of electrolytic plating during which the metal plate 46 is taken as a feeding layer, on areas of the upper surface 46A of the metal plate 46 exposed through the opening sections 47A (first and second metal layer formation processes). As a result, the pads 12 formed from the metal layers 26 to 28 are formed on the metal plate 46. The metal layers 26 to 28 are formed by use of a single plating apparatus. In this case, it is better to use a plating apparatus having a first plating bath filled with a plating solution used for forming the metal plate 26, a second plating bath filled with a plating fluid filled with a plating solution used for forming the metal plate 27, and a third plating bath filled with a plating solution used for forming the metal layer 28.

As mentioned above, as a result of the metal layers 26 to 28 being continuously formed by use of the plating apparatus having the first through third plating baths filled with the different plating solutions, the metal layer 28 that is less subject to oxidation than the metal layer 27 can be formed on the metal layer 27 immediately after formation of the metal layer 27 that is easy to be subject to oxidation. As a result, a time during which an oxide is formed on the metal layer 27 is reduced, so that sufficient adhesion between the metal layer 27 and the metal layer 28 can be ensured sufficiently.

For instance, an Au layer, an Sn layer, SnAg layer (an alloy formed from Sn and Ag by means of plating), or the like, can be used as the metal layer 26. When an Au layer is used as the metal layer 26, the thickness of the metal layer 26 can be set to; for example, 0.1 μm.

The metal layer 27 is formed from metal, whose change amount of free energy ΔF converted as a result of oxidation of metal per gram atom of oxygen is less than −32 kcal. For instance, an Ni layer can be used as the metal layer 27. The change amount of free energy ΔF converted as a result of oxidation of Ni per gram atom of oxygen is −46.1 kcal. When the Ni layer is used as the metal layer 27, the thickness of the metal layer 27 can be set to; for example, 10 μm.

The metal layer 28 that is less subject to oxidation is a metal layer formed from metal, whose change amount of free energy ΔF converted as a result of oxidation of metal per gram atom of oxygen is greater than −32 kcal. For instance, Cu (ΔF=−31.5 kcal), Ag (ΔF=+0.6 kcal), Au (ΔF=+10.5 kcal), Pd, and the like, are available as such a metal layer. For instance, a Cu layer, an Ag layer, an Au layer, a Pd layer, and the like, can be used as the metal layer 28. When a Cu layer is used as the metal layer 28, the thickness of the metal layer 28 can be set to; for example, 10 μm. A layer formed by stacking at least two of the Cu layer, the Ag layer, the Au layer, and the Pd layer may also be used as the metal layer 28.

Figure 17:
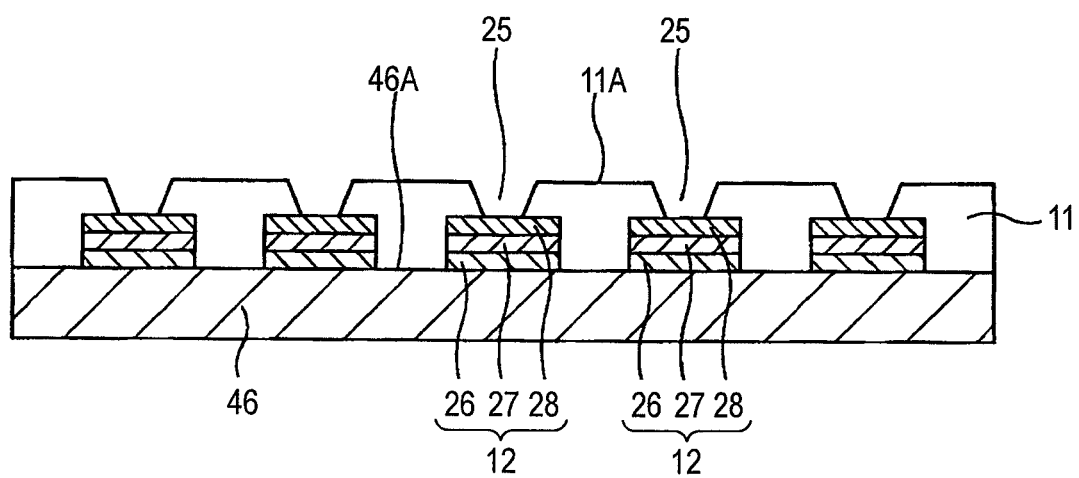
FIG. 17 is a view showing processes for manufacturing the wiring substrate of the first embodiment of the present invention (Part 4)

Next, in a process shown in FIG. 17, the resist film 47 shown in FIG. 16 is eliminated, and the insulation layer 11 having the opening sections 25 is formed over the metal plate 46 and the pads 12. The opening sections 25 are formed by means of subjecting the insulation layer 11 to laser processing. At this time, the opening sections 25 are formed in such a way that the upper surface of the metal layer 28 becomes exposed. A resin layer; for example, an epoxy, polyimide, or the like, can be used as the insulation layer 11.

Figure 18:
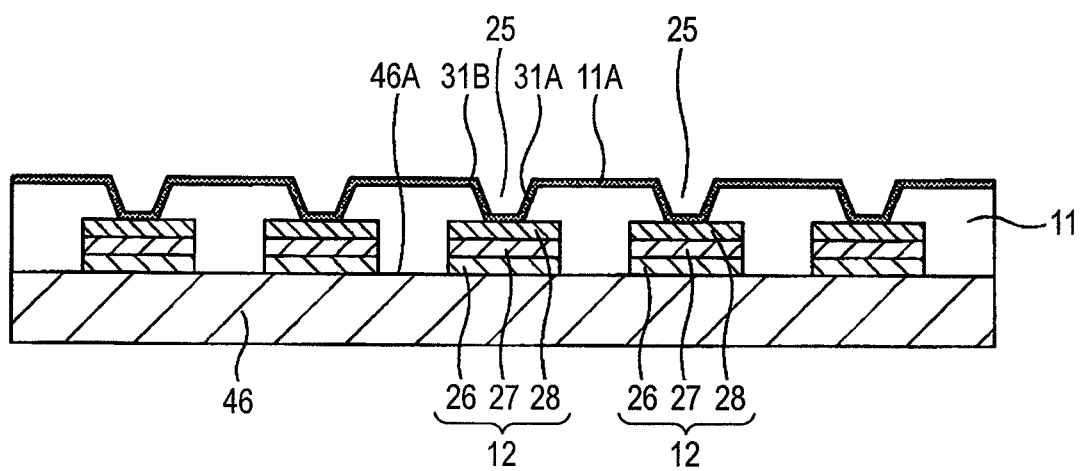
FIG. 18 is a view showing processes for manufacturing the wiring substrate of the first embodiment of the present invention (Part 5)

Next, in a process shown in FIG. 18, a seed layer 31A, which covers surfaces of the insulation layer 11 corresponding to the side surfaces of the respective opening sections 25 and areas of the upper surface of the metal layer 28 exposed through the opening sections 25, and a seed layer 31B covering the upper surface 11A of the insulation layer 11 are formed simultaneously. The seed layers 31A and 31B can be formed by means of; for example, sputtering, vacuum deposition, electroless plating, or the like. For instance, a Cu layer can be used for the seed layers 31A and 31B. The thickness of the seed layers 31A and 31B can be set to; for example, 3 μm.

Figure 19:
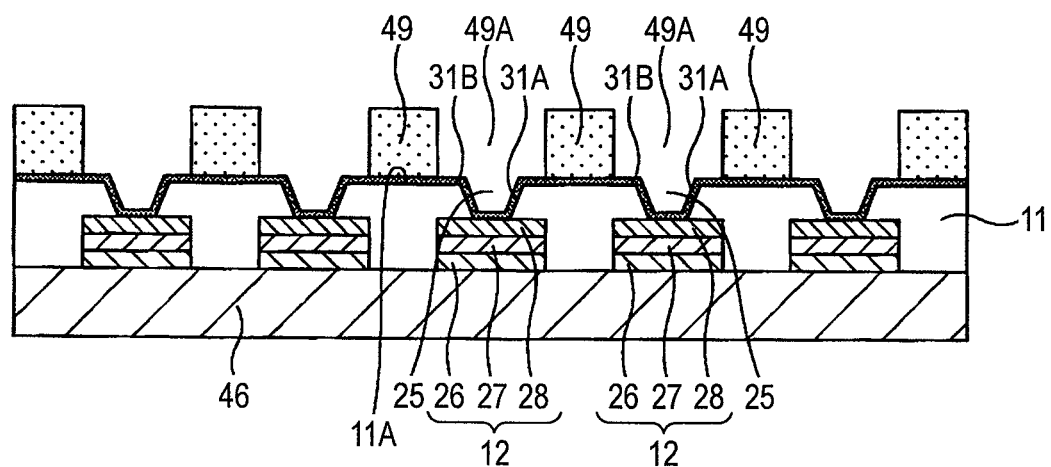
FIG. 19 is a view showing processes for manufacturing the wiring substrate of the first embodiment of the present invention (Part 6)

In a process shown in FIG. 19, a resist film 49 having opening sections 49A is formed on the seed layer 31B. The opening sections 49A are formed in such a way that areas of the see layers 31A and 31B corresponding to the areas, where the vias 13 and the wiring lines 14 are formed, become exposed.

Figure 20:
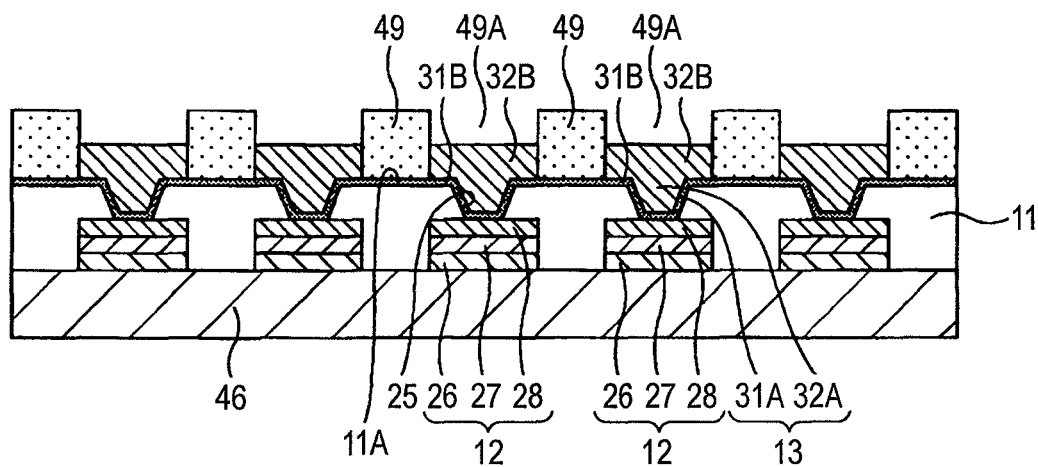
FIG. 20 is a view showing processes for manufacturing the wiring substrate of the first embodiment of the present invention (Part 7)

In a process shown in FIG. 20, the Cu films 32A and 32B are formed simultaneously on the seed layers 31A and 31B exposed through the opening sections 49A by means of electrolytic plating during which the seed layers 31A and 31B are taken as feeding layers. As a result, the vias 13, each of which is formed from the seed layer 31A and the Cu film 32A, are formed in the respective opening sections 25 (a via formation process). The vias 13 are connected to the metal layer 28 which is less subject to oxidation.

As mentioned above, the metal layer 28 that is less subject to oxidation than the metal layer 27 and the vias 13 are connected together, thereby preventing presence of an oxide between the pads 12 and the vias 13. Thereby, adhesion between the pads 12 and the vias 13 is enhanced, and the reliability of electrical connection between the pads 12 and the vias 13 can be ensured sufficiently.

Figure 21:
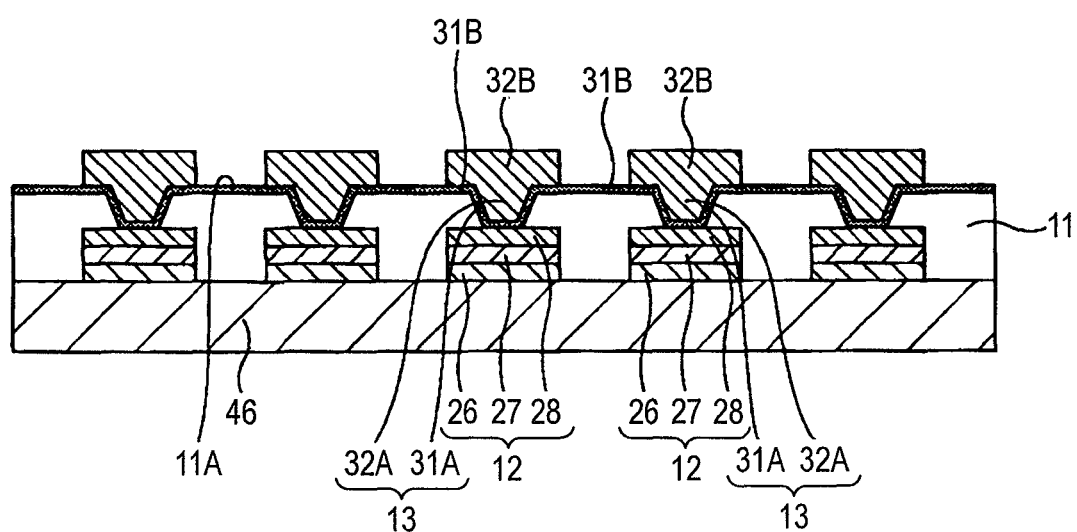
FIG. 21 is a view showing processes for manufacturing the wiring substrate of the first embodiment of the present invention (Part 8)
Figure 22:
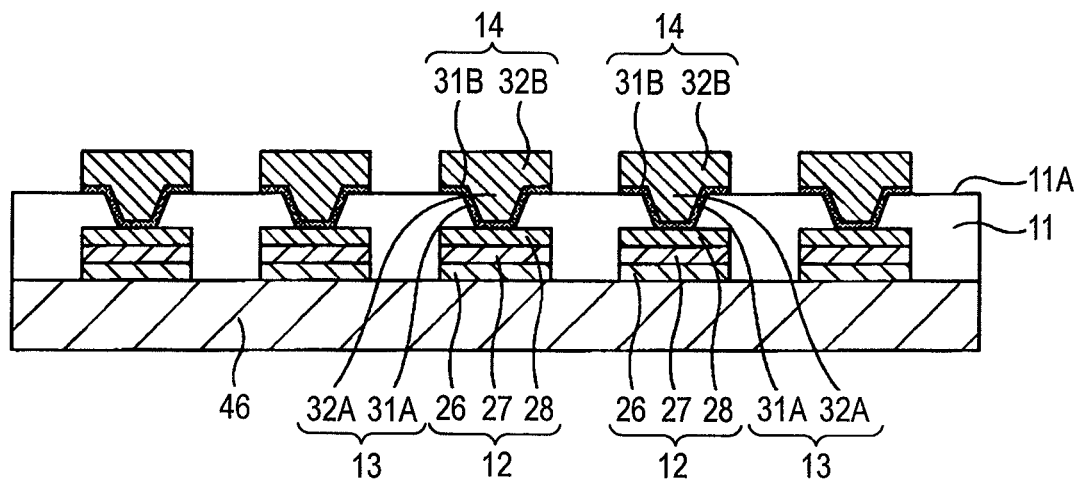
FIG. 22 is a view showing processes for manufacturing the wiring substrate of the first embodiment of the present invention (Part 9)

Next, in a process shown in FIG. 21, the resist film 49 shown in FIG. 20 is eliminated. Next, in a process shown in FIG. 22, the seed layer 31B (see FIG. 21) which is not covered with the Cu film 32B (see FIG. 21) is etched away. Thereby, the wiring lines 14, each of which is formed from the seed layer 31B and the Cu film 32B, are formed.

Figure 23:
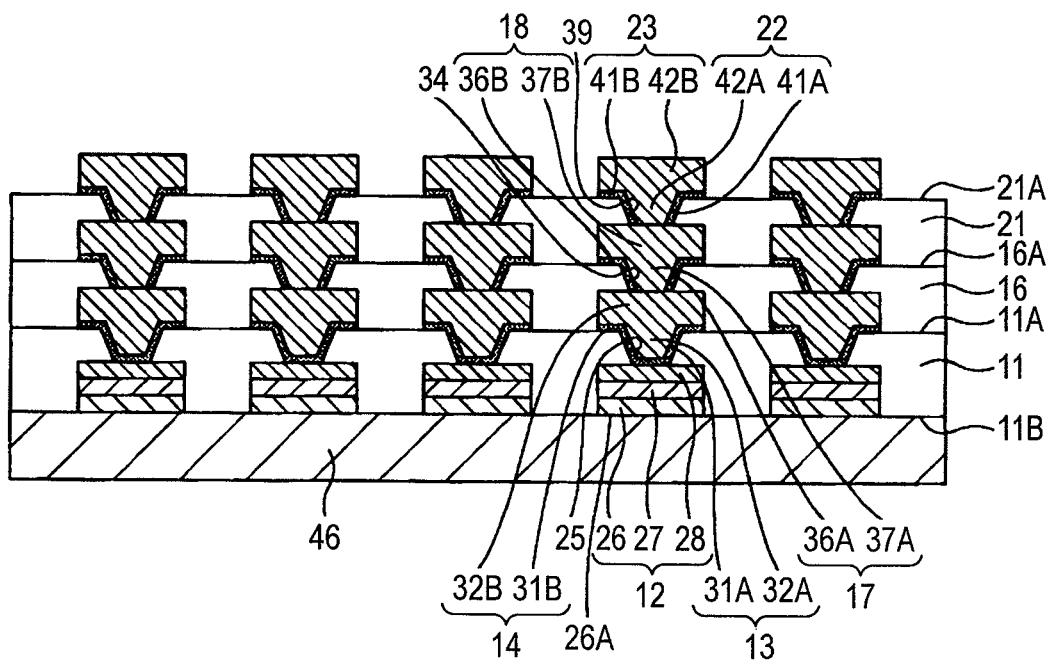
FIG. 23 is a view showing processes for manufacturing the wiring substrate of the first embodiment of the present invention (Part 10)

Next, in a process shown in FIG. 23, processing analogous to the previously-described processes shown in FIGS. 17 through 22 is iterated, whereby the resin layers 16 and 21, the vias 17 and 22, and the wiring lines 18 and 23 are formed on the metal plate 46. Thereby, a structure corresponding to the wiring substrate 10 is formed over the metal plate 46.

Figure 24:
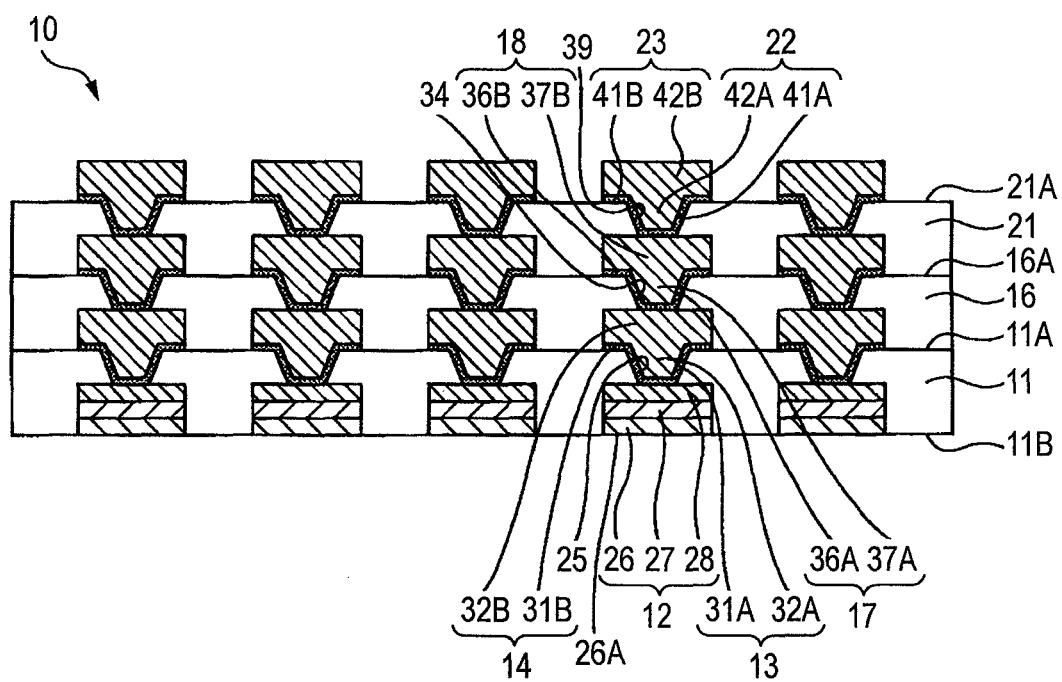
FIG. 24 is a view showing processes for manufacturing the wiring substrate of the first embodiment of the present invention (Part 11)

In a process shown in FIG. 24, the metal plate 46 shown in FIG. 23 is etched away, whereby the wiring substrate 10 is manufactured.

According to the method for manufacturing a wiring substrate of the present embodiment, as a result of the metal layer 26, the metal layer 27, and the metal layer 28 that is less subject to oxidation than the metal layer 27, constituting the pads, are continuously formed by means of plating. As a result, a time during which an oxide is formed on the metal layer 27 is reduced, so that sufficient adhesion between the metal layer 27 and the metal layer 28 can be ensured sufficiently.

The metal layer 28 that is less subject to oxidation than the metal layer 27 and the vias 13 are connected together, thereby preventing presence of an oxide between the pads 12 and the vias 13. Thereby, adhesion between the pads 12 and the vias 13 is enhanced, and the reliability of electrical connection between the pads 12 and the vias 13 can be ensured sufficiently.

Figure 1:
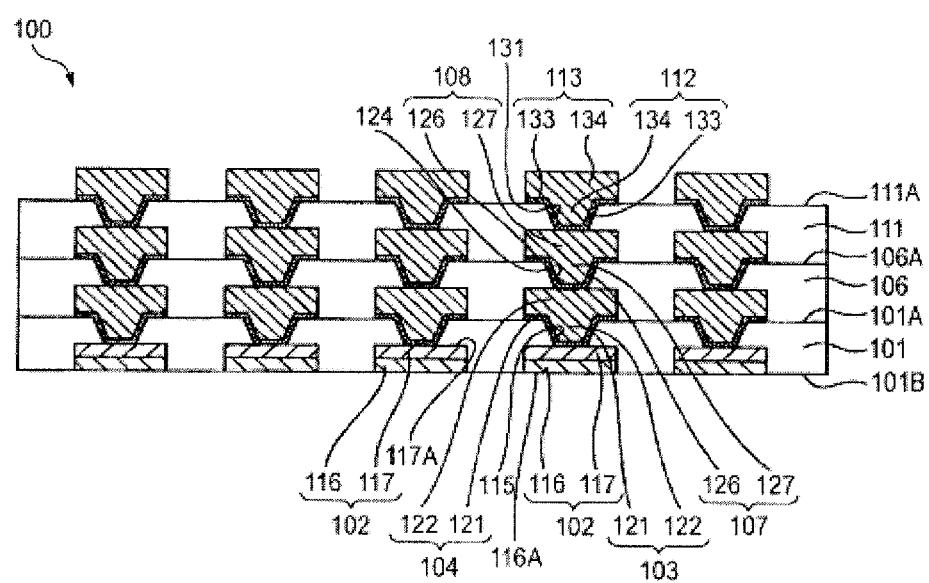
FIG. 1 is a cross-sectional view of a related-art wiring substrate.
Figure 2:
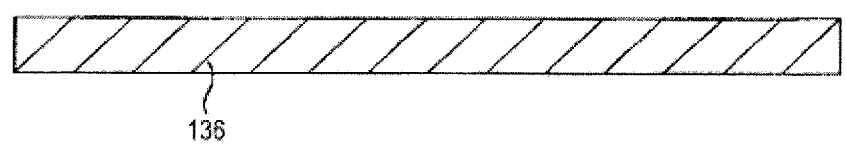
FIG. 2 is a view showing processes for manufacturing the related-art wiring substrate (Part 1)
Figure 3:
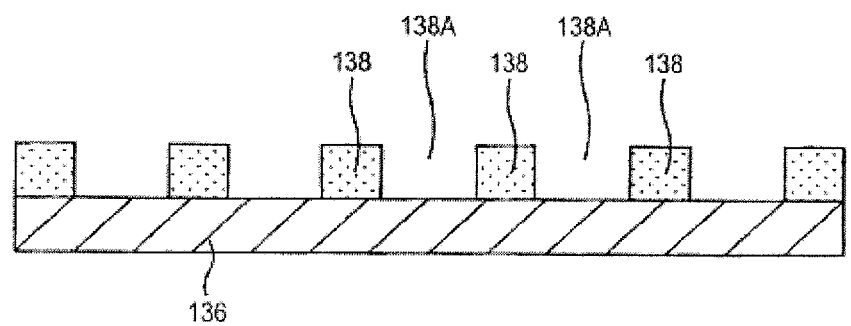
FIG. 3 is a view showing processes for manufacturing the related-art wiring substrate (Part 2)
Figure 4:
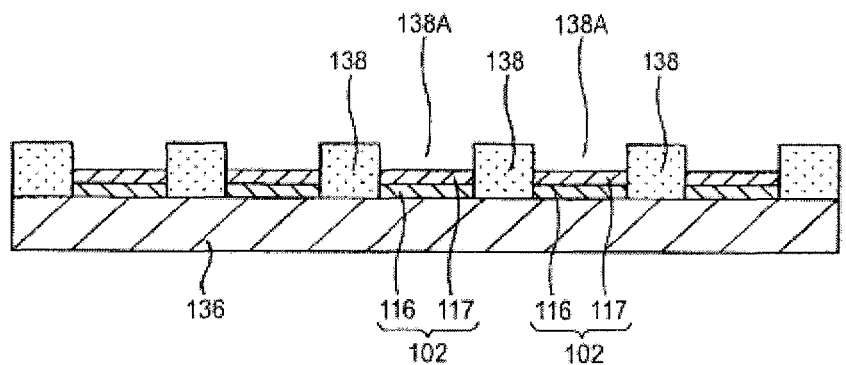
FIG. 4 is a view showing processes for manufacturing the related-art wiring substrate (Part 3)
Figure 5:
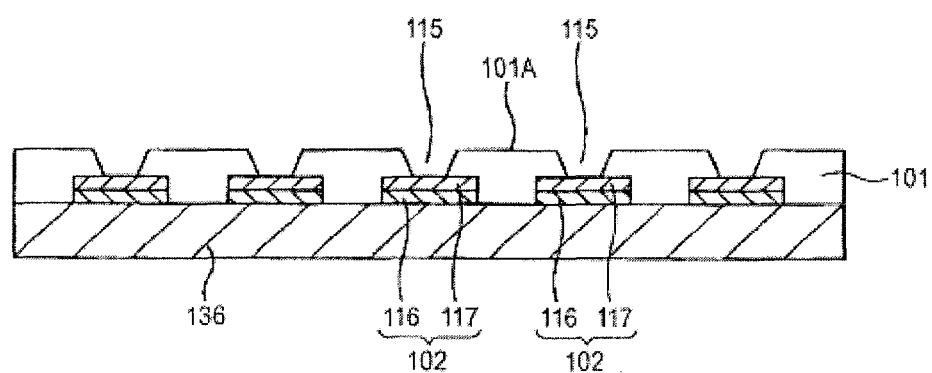
FIG. 5 is a view showing processes for manufacturing the related-art wiring substrate (Part 4)
Figure 6:
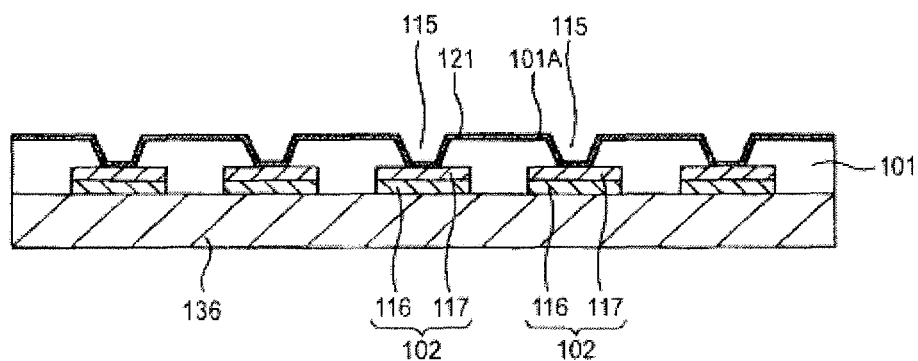
FIG. 6 is a view showing processes for manufacturing the related-art wiring substrate (Part 5)
Figure 7:
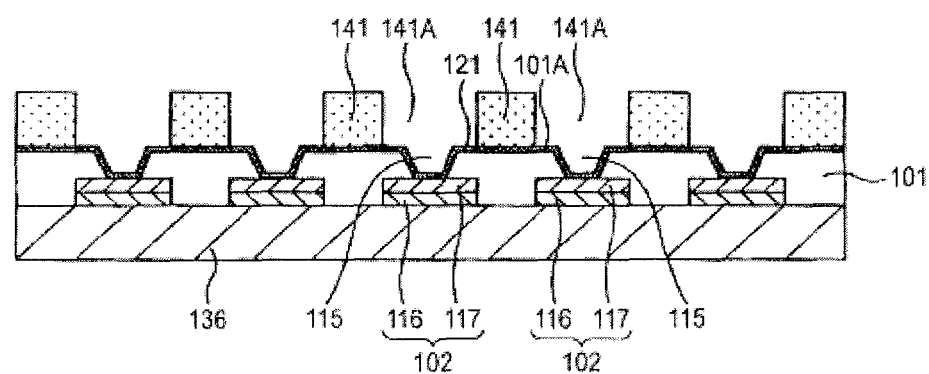
FIG. 7 is a view showing processes for manufacturing the related-art wiring substrate (Part 6)
Figure 8:
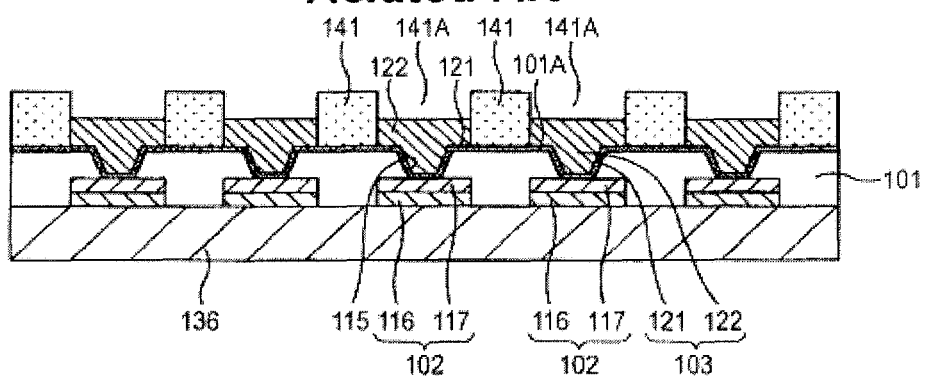
FIG. 8 is a view showing processes for manufacturing the related-art wiring substrate (Part 7)
Figure 9:
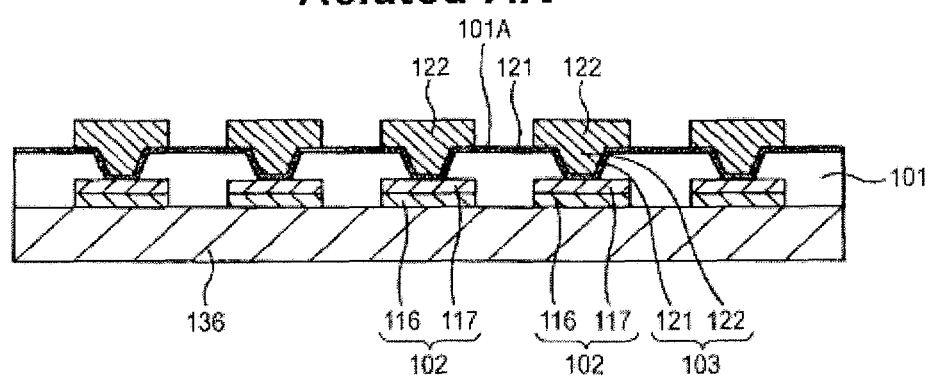
FIG. 9 is a view showing processes for manufacturing the related-art wiring substrate (Part 8)
Figure 10:
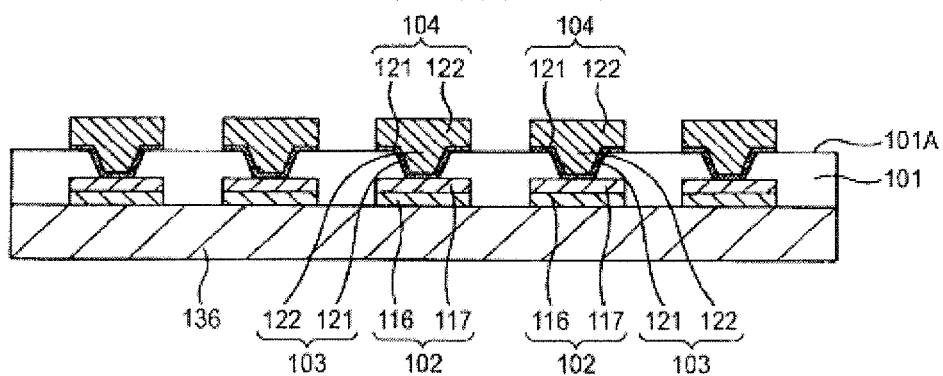
FIG. 10 is a view showing processes for manufacturing the related-art wiring substrate (Part 9)
Figure 11:
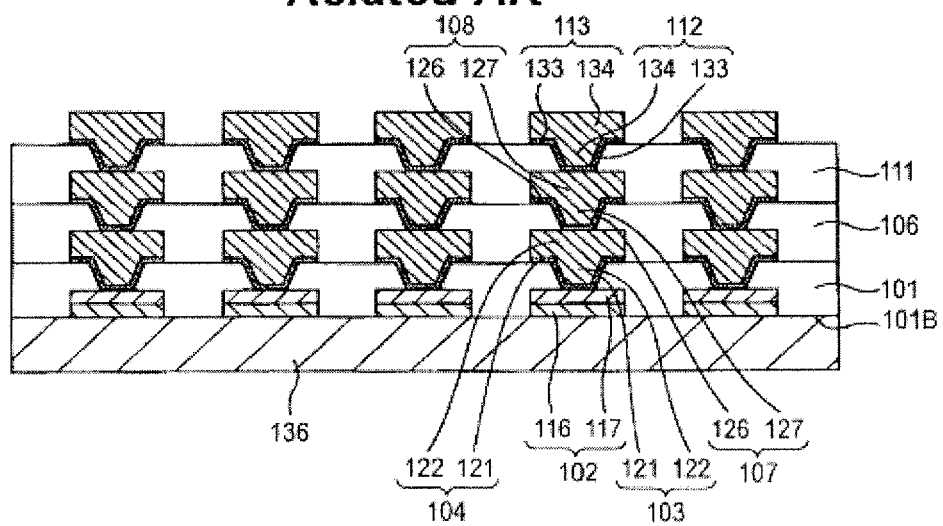
FIG. 11 is a view showing processes for manufacturing the related-art wiring substrate (Part 10)
Figure 12:
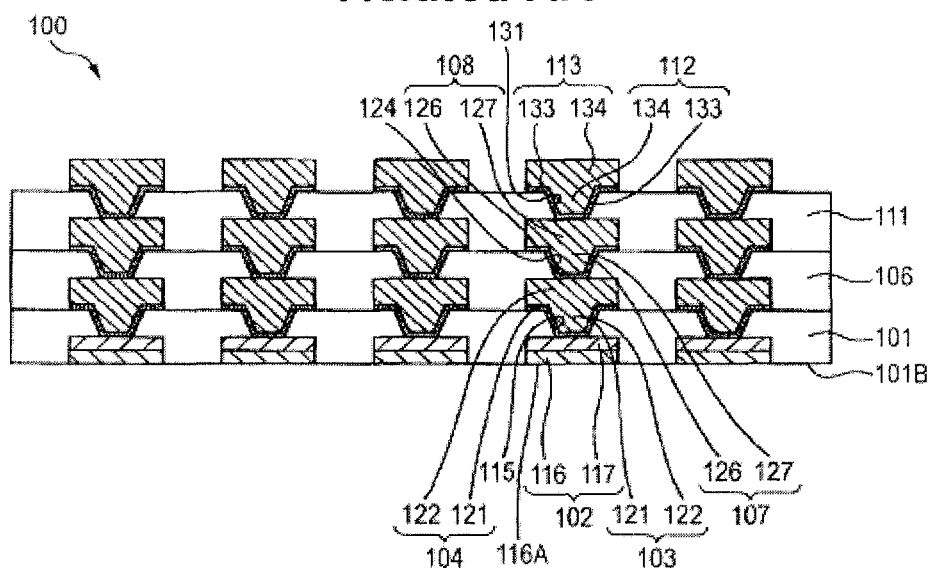
FIG. 12 is a view showing processes for manufacturing the related-art wiring substrate (Part 11)

A process for roughening the upper surface of the metal layer 28 may also be provided between the process shown in FIG. 16 and the process shown in FIG. 17. Thus, as a result of the upper surface of the metal layer 28 being roughened, adhesion between the pads 12 and the vias 13 can be enhanced. Roughening can be performed by means of roughening the upper surface of the metal layer 28 through use of an etchant. In the related-art pads 102 (see FIG. 1), the Ni layer 117 that is easy to be subject to oxidation is provided in the uppermost layer of each of the pads 102. Hence, when the Ni layer 117 is roughened, the oxide film is formed on the Ni layer 117. However, in the present embodiment, the metal layer 28 that is less subject to oxidation is roughened, thereby preventing formation of an oxide on the metal layer 28. Hence, adhesion between the pads 12 and the vias 13 can be enhanced.

Second Embodiment

Figure 25:
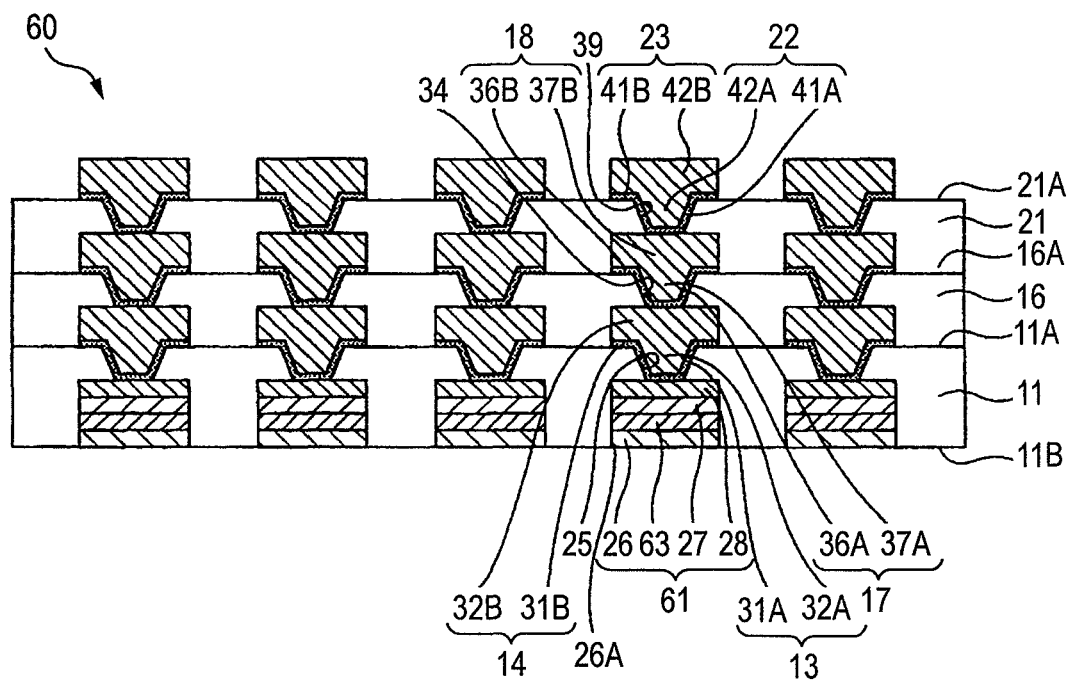
FIG. 25 is a cross-sectional view of a wiring substrate of a second embodiment of the present invention.

FIG. 25 is a cross-sectional view of a wiring substrate of a second embodiment of the present invention. In FIG. 25, constituent elements which are the same as those of the wiring substrate 10 of the first embodiment are assigned the same reference numerals.

By reference to FIG. 25, a wiring substrate 60 of the second embodiment is formed similarly to the wiring substrate 10 except that pads 61 are provided in place of the pads 12 provided in the wiring substrate 10 of the first embodiment.

Each of the pads 61 is structured such that the metal layer 26, a metal layer 63, the metal layer 27, and the metal layer 28 that is less subject to oxidation than the metal layer 27 are provided sequentially. In short, the pads 61 are formed similarly to the pads 12 except that the metal layer 63 is provided between the metal layer 26 and the metal layer 27 in the pad 12 described in connection with the first embodiment.

The metal layer 63 has a function of preventing oxidation of the metal layer 26. For instance, a Pd layer can be used as the metal layer 63. The thickness of the metal layer 63 can be set to; for example, 0.1 μm.

According to the wiring substrate of the present embodiment, the metal layer 63 having the function of preventing oxidation of the metal layer 26 is provided between the metal layer 26 and the metal layer 27 that is easy to be subject to oxidation, whereby oxidation of the metal layer 26 can be prevented. Further, the wiring substrate 60 of the present embodiment can obtain the same advantage as the wiring substrate 10 of the first embodiment.

The wiring substrate 60 of the present embodiment can be manufactured by means of the same processes as the wiring substrate 10 of the first embodiment.

Although the preferred embodiments of the present invention have been described in detail thus far, the present invention is not limited to specific embodiments and is susceptible to various modifications or alterations within the scope of the gist of the present invention described within the scope of the appended claims.

The present invention can be applied to a wiring substrate having a pad which includes a metal layer exposed through a wiring substrate and a first metal interposed between the metal layer and vias for preventing diffusion of metal included in the vias into the metal layer and to a method for manufacturing the wiring substrate.

What is claimed is:
1. A wiring substrate comprising:
an insulation layer;
a pad including a plurality of metal layers, the pad disposed in the insulation layer; and
a via connected to the pad,
wherein the plurality of metal layers include a metal layer forming the lowermost layer of the pad exposed through the wiring substrate, a first metal layer which is interposed between the metal layer and the via and which prevents diffusion of metal included in the via into the metal layer, and a second metal layer which is less subject to oxidation than the first metal layer and which is provided between the via and the first metal layer,
wherein the via is connected to the second metal layer,
wherein an upper surface of the second metal layer at an interface with the via is a roughened surface that is rougher than an initial roughness of the upper surface so as to provide an improved electric contact and adhesion between the via and the second metal layer, an oxide film not being formed on the roughened surface of the second metal layer, and
wherein the metal layer is made using any one of a Au layer, a Sn layer, and a SnAg layer.

2. The wiring substrate according to claim 1, wherein the second metal layer is formed from at least one of a Cu layer, an Ag layer, an Au layer, and a Pd layer.

3. A method for manufacturing a wiring substrate comprising:
   providing an insulation layer;
   a pad formation process for forming a pad including a plurality of metal layers in the insulation layer, the plurality of metal layers including a metal layer forming the lowermost layer of the pad exposed through the wiring substrate, a first metal layer which is provided on the metal layer and which prevents diffusion of metal included in a via into the metal layer, and a second metal layer which is provided on the first metal layer and which is less subject to oxidation than the first metal layer, the metal layer is made using any one of a Au layer, a Sn layer, and a SnAg layer; and
   a via and wiring formation process for forming integrally the via on the second metal layer and the wiring on a surface of the insulation layer,
   wherein the pad formation process further comprises,
   roughening a surface of the second metal layer at an interface for the via so that the surface is rougher than an initial roughness of the surface to provide an improved electric contact and adhesion between the via and the second metal layer, an oxide film not being formed on the roughened surface of the second metal layer,
   forming the pad on a supporting plate by forming the metal layer on the supporting plate, then the first metal layer on the metal layer, and then the second metal layer on the first metal layer by plating,
   wherein providing the insulation layer further comprises:
      forming the insulation layer over the supporting plate and the pad so that the insulation layer covers an upper surface of the second metal layer and a side surface of the pad, and
      forming an opening section in the insulation layer so that the upper surface of the second metal layer is exposed,
   wherein the via and wiring formation process further comprises forming the via in the opening section of the insulation layer so that the via connects to second metal layer,
   said method further comprising,
   removing the supporting plate so as to expose another surface of the insulation layer and a surface of the metal layer of the pad.

4. The method for manufacturing a wiring substrate according to claim 3, wherein the pad formation process includes a first and second metal layer formation process for continuously forming the first metal layer and the second metal layer by means of plating.

5. The method for manufacturing a wiring substrate according to claim 3, wherein the second metal layer is formed from at least one of a Cu layer, an Ag layer, an Au layer, and a Pd layer.

6. The wiring substrate according to claim 1,
   wherein the insulation layer is provided so as to cover the upper surface of the second metal layer and a side surface of the pad,
   wherein a lower surface of the metal layer is exposed through the insulation layer,
   wherein the insulation layer further comprises an opening section formed in the insulation layer so that a portion of the upper surface of the second metal layer is exposed, and
   wherein the via is provided in the opening section formed in the insulation layer so that the via is connected to the exposed portion of the upper surface of the second metal layer.

7. The wiring substrate according to claim 1,
   wherein the insulation layer is provided so as to cover the upper surface of the second metal layer,
   wherein the insulation layer further comprises an opening section formed in the insulation layer so that a portion of the upper surface of the second metal layer is exposed, and
   wherein the via is provided in the opening section formed in the insulation layer so that the via is connected to the exposed portion of the upper surface of the second metal layer.

8. The wiring substrate according to claim 1, further comprising a third metal layer disposed between the metal layer and the first metal layer.

9. The wiring substrate according to claim 1, wherein the via further comprises a seed layer.

10. The method for manufacturing a wiring substrate according to claim 3, wherein the pad formation process further comprises disposing a third metal layer on the metal layer and then disposing the first metal layer on the third metal layer.

11. The method for manufacturing a wiring substrate according to claim 3, further comprising:
   forming a seed layer on a surface of the insulation layer and a surface of the opening section of the insulation layer; and
   forming a wiring connected to the via by performing electrolytic plating with the seed layer used as a feeding layer.

12. The wiring substrate according to claim 1, wherein a Ni layer is used as the first metal layer.

13. The wiring substrate according to claim 1, wherein a plurality of wiring lines and a plurality of insulating layers are provided on the insulating layer.

14. The wiring substrate according to claim 8, wherein a Pd layer is used as the third metal layer.

15. The method for manufacturing a wiring substrate according to claim 3, wherein the pad formation process further comprises:
   using a Ni layer as the first metal layer.

16. The method for manufacturing a wiring substrate according to claim 3, further comprising:
   providing a plurality of wiring lines and a plurality of insulating layers on the insulating layer.

17. The method for manufacturing a wiring substrate according to claim 10, wherein the pad formation process further comprises:
   using a Pd layer as the third metal layer.

18. The wiring substrate according to claim 1, wherein the second metal layer and the via are made of a same metal.

19. The method for manufacturing a wiring substrate according to claim 3, wherein the second metal layer and the via are made of a same metal.

20. The wiring substrate according to claim 1, wherein only the surface of the second metal layer that is at the interface with the via is roughened.

21. The method for manufacturing a wiring substrate according to claim 3, wherein only the surface of the second metal layer that is at the interface with the via is roughened.

* * * * *